United States Patent
Watts et al.

(10) Patent No.: US 8,471,172 B2
(45) Date of Patent: Jun. 25, 2013

(54) ELIMINATION OF SHORT CIRCUITS BETWEEN CONDUCTORS BY LASER ABLATION

(75) Inventors: Jim Watts, Cambridge (GB); Paul A. Cain, Cambridge (GB); Mike J. Banach, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 872 days.

(21) Appl. No.: 12/518,599

(22) PCT Filed: Dec. 6, 2007

(86) PCT No.: PCT/GB2007/004677
§ 371 (c)(1),
(2), (4) Date: Aug. 13, 2009

(87) PCT Pub. No.: WO2008/071920
PCT Pub. Date: Jun. 19, 2008

(65) Prior Publication Data
US 2010/0018956 A1 Jan. 28, 2010

(30) Foreign Application Priority Data
Dec. 14, 2006 (GB) .................................. 0625001.3

(51) Int. Cl.
*H05K 3/28* (2006.01)
*H05K 3/383* (2006.01)

(52) U.S. Cl.
USPC ............... 219/121.6; 219/121.68; 219/121.69

(58) Field of Classification Search
USPC .. 257/E21.252, E21.526; 438/4, 14; 382/145, 382/149; 219/121.6, 121.68
See application file for complete search history.

(56) References Cited

U.S. PATENT DOCUMENTS

| | | | | |
|---|---|---|---|---|
| 5,022,955 | A | * | 6/1991 | Chen ................................ 216/21 |
| 5,124,816 | A | | 6/1992 | Yoshihara et al. |
| 5,518,956 | A | * | 5/1996 | Liu et al. ............................ 438/4 |
| 6,047,083 | A | * | 4/2000 | Mizuno ......................... 382/141 |
| 7,547,560 | B2 | * | 6/2009 | Patterson et al. ................. 438/4 |
| 8,112,883 | B2 | * | 2/2012 | Nakasu ............................ 29/847 |
| 2005/0106507 | A1 | | 5/2005 | Bernds et al. |
| 2005/0196032 | A1 | | 9/2005 | Nedivi |
| 2005/0255611 | A1 | | 11/2005 | Patterson et al. |
| 2008/0313893 | A1 | * | 12/2008 | Nakasu ........................... 29/830 |

FOREIGN PATENT DOCUMENTS

| | | |
|---|---|---|
| EP | 0 366 459 A2 | 5/1990 |
| EP | 0 642 158 A1 | 3/1995 |
| WO | 2006/129126 A2 | 12/2006 |
| WO | 2007/029028 A1 | 3/2007 |

OTHER PUBLICATIONS

European Search Report corresponding to European Patent Application No. 07858779.7, dated Sep. 21, 2012.

\* cited by examiner

*Primary Examiner* — Zandra Smith
*Assistant Examiner* — Tsz Chiu
(74) *Attorney, Agent, or Firm* — Sughrue Mion, PLLC

(57) ABSTRACT

A method of selectively eliminating electrical shorts and other electrical defects from specific layers of a multilayer electronic device without damaging underlying layers. The method is based on a combination of an automated detection of the defects and selective laser ablation patterning (SLAP).

16 Claims, 4 Drawing Sheets

ELIMINATION OF SHORT CIRCUITS BETWEEN CONDUCTORS BY LASER ABLATION

CROSS REFERENCE TO RELATED APPLICATIONS

This application is a National Stage of International Application No. PCT/GB2007/004677 filed Dec. 6, 2007, claiming priority based on Great Britain Application No. 0625001.3 filed Dec. 14, 2006, the contents of all of which are incorporated herein by reference in their entirety.

The present invention relates to a method of eliminating defects in electronic devices. In one embodiment, it relates to selectively isolating electrical defects between conductive layers within a multiple layer electronic device, such as a thin film transistor (TFT) structure, by a process which uses an optical method of detection to identify defects coupled with a method of selective laser ablation patterning to isolate defects.

Methods for disconnecting defective transistors from a thin film transistor array by the use of a laser beam are well known within the prior art for cutting through conductive layers of a device within an integrated circuit. However, such laser ablation methods have been coupled with complicated methods for detecting electrical shorts in such devices within the prior art disclosures, such as methods of electrical detection.

In JP02281133 a method is disclosed for isolating an electrical short from within a thin film transistor array, using a laser beam to cut through a gate line. In this disclosure, a method of detecting the short is described where microplasma light is emitted from the position of the circuit where said short has occurred. This method has the disadvantage that it can result in damage to the underlying layer structure and also cut/damage underlying metal interconnects/electrodes and semiconducting/dielectric layers, in particular if the method was applied to multilayer organic electronic devices comprising organic semiconducting layers and polymer dielectric layers. This means that this prior art method is limited to repairing defects for which such damage is not leading to additional problems. For example, the method cannot be applied to intralayer defects, where a short exists between two neighbouring electrodes/interconnects on an upper layer.

In JP63240527, a laser beam is used to isolate a short between a gate line, which is being driven from both ends, and a counter electrode. The short is identified within a silicon device that operates a liquid crystal display media. In this disclosure, a bridging part is produced on the substrate surface, to form part of the gate line, such that this bridging part of the gate line may be easily cut by a laser beam, by producing the bridging part of a reduced thickness. This bridging part may also be readily accessed from the underside of the substrate.

It is an aim of the present invention to provide an alternative technique for eliminating electrical defects in electronic devices.

According to the present invention, there is provided a method of processing a product defining a plurality of part or whole electronic devices, the method comprising: the automated step of identifying an electrical defect by a comparison of the pattern of a plurality of regions of the product; and the step of eliminating said electrical defect by laser ablation.

In one embodiment, the electrical defect is an electrical short; the step of eliminating said electrical defect comprises removing conductive material so as to isolate one conductive element from another, co-planar conductive element; the laser ablation is carried out so as to avoid any substantial degradation of a layer directly below the conductive material to be removed; and a single laser pulse is used to remove said conductive material and expose the layer directly below the conductive material.

In one embodiment, the electrical defect is an electrical short caused by a piece of unwanted conductive material bridging a conductive line connecting one electronic device and two or more other electronic devices and another conductive element of said plurality of electronic devices, and wherein the step of eliminating said electrical defect comprises removing a portion of said conductive line without completely cutting said conductive line. For example, said another conductive element may be coplanar with said conductive line, and the laser ablation is preferably carried out so as to avoid any substantial degradation of a layer directly below said conductive line.

According to one embodiment, the electrical defect is an electrical short caused by a piece of unwanted conductive material bridging two conductive regions of the plurality of electronic devices. The defect may, for example, be removed by laser ablation of a part of at least one of said two conductive regions. The two conductive regions may, for example, be an electrode and an interconnect, such as a gate electrode and a COM line; the source and drain electrodes of one of said plurality of electronic devices; the pixel electrode of one electronic device and the pixel electrode of another electronic device; or a gate electrode and a source and/or drain electrode.

In one embodiment, the plurality of electronic devices include one or more organic elements.

According to one embodiment of the invention, there is provided a technique for eliminating defects in organic multi-layer structures. According to one embodiment, there is provided a technique by which it is possible to achieve effective isolation of electrical shorts between neighbouring electrodes/interconnects without damage to underlying layers.

According to one embodiment of the present invention, there is provided a method that can be applied to selectively isolating intra-layer electrical shorts, where the configuration of the device is such that the gate line and the COM electrode are in the same plane of the device, as well as inter-layer electrical shorts. Selective ablation to isolate the electrical shorts occurs without causing any damage to the underlying layers of the device.

The present invention uses an optical detection method that is able to detect electrical shorts which therefore enables the selective ablation of these shorts more readily within the layers of a stack of a device than is possible with other more complicated disclosed methods within the prior art, examples of which are mentioned above.

One embodiment of the present invention uses a combination of optical detection of the defects and selective laser ablation patterning to cut through conductive lines without damaging the underlying layer structure, and in this way isolate/remove the defects.

According to one embodiment, there is provided a method of isolating areas of a multiple layer thin film transistor structure where an electrical contact has occurred between conductive layers.

According to a preferred embodiment of the present invention, a method is provided wherein an automated optical inspection technique is used to detect a defect positioned within a particular layer of a device within a multiple layer TFT structure. Such a defect may arise from a piece of debris bridging two conductive structures, such as for example in the case of an active matrix display, shorts between a gate interconnect and a neighbouring common ground line (COM) or shorts between neighbouring data or gate addressing lines. Once detected, the intralayer short may be selectively ablated to isolate the short, by cutting one of the electrodes with a laser beam without damage to underlying layers. Preferably, the repair involves removal of material from the layer within which the short occurs by selective laser ablation patterning (SLAP) as described in WO06/129126. The entire content of WO06/129126 is included in the present application by way of reference. It discloses the use of a short laser pulse to remove a thin metal layer from a multilayer substrate without damage/removal of material from layers underneath the metal layer.

To help understanding of the invention, a specific embodiment thereof will now be described by way of example and with reference to the accompanying drawings, in which.

EXAMPLE 1

A method of isolating an electrical short caused by debris positioned between a COM line (otherwise known as a common electrode) and a gate electrode using an automated optical inspection technique and a process of selective laser ablation.

An automated optical inspection technique is used to detect debris bridging an in-plane COM electrode and gate electrode, therefore creating an electrical short. Once detected, the COM-gate electrical short is selectively isolated, by producing at least one cut through the COM electrode; the cuts being positioned both before and after the abridged debris in order to isolate the short. In the present example, if the COM line is driven from both ends two cuts are required. Otherwise is single cut on the side of the short from which the COM line is driven might be sufficient.

Figure 1:
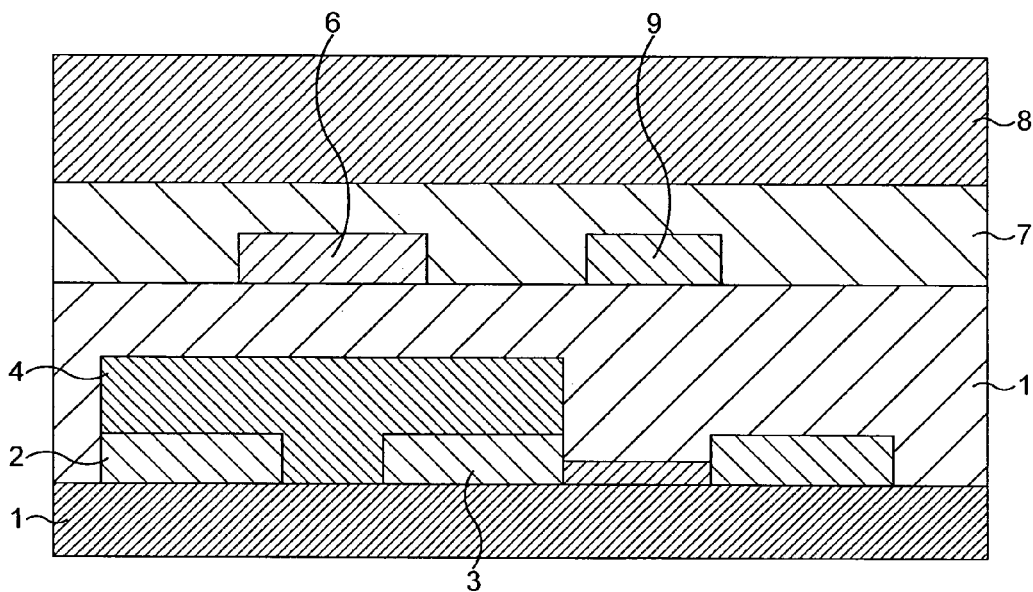
FIG. 1 shows a multiple layer thin film transistor structure.

As illustrated in FIG. 1, conductive material is deposited and patterned on a substrate 1 to form source and drain electrodes 2, 3. The substrate may be either glass or a polymer film, but preferably a plastic substrate such as polyethyleneterephtalate (PET) or polyethylenenaphtalene (PEN) is used. The patterned conductive layer 2, 3 comprises a conducting polymer, such as PEDOT, or a metallic material, such as gold, copper or silver. It may be deposited and patterned through solution processing techniques such as, but not limited to, spin, dip, blade, bar, slot-die, or spray coating, inkjet, gravure, offset or screen printing. Alternatively, vacuum deposition such as evaporation, or sputtering followed by photolithographic patterning or other subtractive patterning techniques, such as laser ablation may be used.

Once the conductive layer has been patterned to form the source and drain electrodes, a layer of semiconducting material 4 may then be deposited over the substrate and patterned electrodes. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used. A broad range of deposition techniques may be used to deposit the semiconducting material including, but not limited to, blade coating, dip coating, curtain coating, meniscus coating, spray coating, or extrusion coating, inkjet printing, offset printing, gravure printing or flexographic printing. The typical thickness of the semiconducting layer is on the order of 50-100 nm after solvent evaporation. In addition, an evaporative process may also be used. A preferred technique is ink jet printing. If the layer is ink jet printed, a minimum amount of semiconductor material may be used, which is both environmentally and economically advantageous.

A layer of gate dielectric material 5 is then deposited onto the layered substrate. In the case of an organic semiconductor polymeric gate dielectrics, such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used. Alternatively, a vacuum or plasma deposited dielectric such as parylene or $SiN_x$ may be used. Optionally more than one dielectric layer may be deposited to form a dielectric stack.

The deposition of the dielectric layer is then followed by the deposition of a gate electrode 6, interconnect lines, and COM electrode 9. The gate electrode may comprise a thin film of inorganic metal such as gold or a cheaper metal such as copper, of a thickness suitable for the desired conductivity. The gate electrode may be deposited using techniques such as sputtering or evaporation techniques or solution processing techniques such as spin, dip, blade, bar, slot-die, gravure, offset or screen printing. The selective ablation process described below is more easily achieved for thin layers of metal than for thick layers. However, in many cases a minimum layer thickness is required in order to reach the necessary conductance. For a gold layer a thickness of 50 nm provides a useful conductance for a range of applications, including gate and COM interconnections for flat panel displays.

A preferred method of fabricating electronic devices using techniques of selective laser ablation to remove material from a conductive layer of a multilayer structure, without causing any significant degradation to an underlying layer is disclosed in WO06/129126. With this technique, use of a single laser pulse is able to guarantee substantially no degradation of the underlying layer.

The technique of selective laser ablation pattering (SLAP) allows patterning by laser ablation of metallic layers on upper layers of a device without radiation induced damage of lower, underlying layers. It uses short pulse lasers for the fabrication of thin film transistor (TFT) structures. This technique incorporating selective laser ablation uses a single shot per imaging area of a short pulse laser to pattern layers of metallic material on top of underlying layers in order to produce fine features of a TFT device.

An example of the use of selective laser patterning is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing much of the energy to enter the material and to be absorbed within the layer to be ablated which will result in the act of ablation before any substantial thermalization actually occurs, that can lead to degradation/ablation of underlying layer. This technique can be employed for patterning of metal electrodes and interconnects on the various upper levels of the device in a step-and-repeat fashion.

It is noted that for a large-area substrate the substrate area which can be exposed in a single step is limited by the laser intensity needed for ablation, and the required accuracy of distortion compensation. The distortion compensation with the SLAP technique is achieved by adjusting the relative position of individual exposure areas with respect to each other in order to maintain accurate alignment between the upper layer patterned by the laser with respect to the lower layer pattern defined previously, and by laying out the circuit in such a way that in the overlap areas where multiple exposures occurs no damage is down to functional layers, in particular interconnects (for more details, see WO2007029028).

Figure 2:
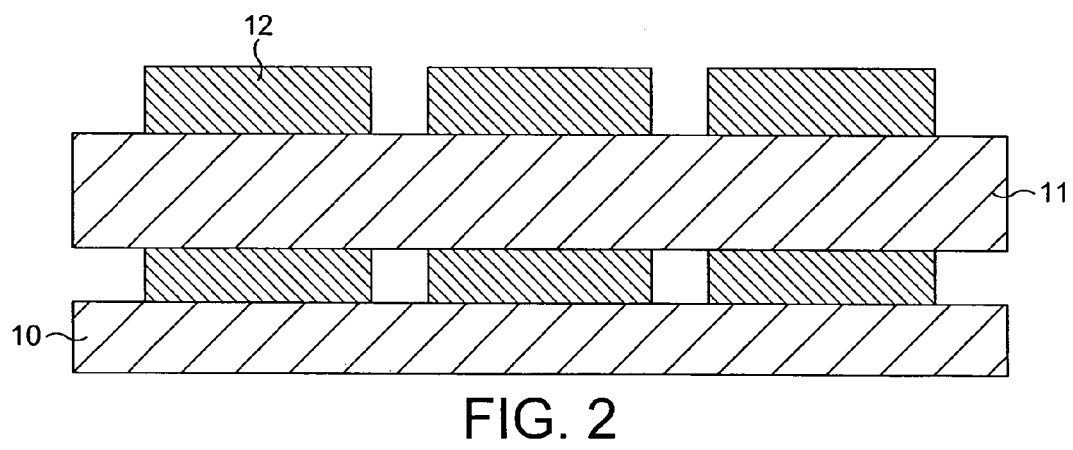
FIG. 2 shows the position of the common electrode and the gate electrode relative to the underlying pixel electrode in an active matrix display.

FIG. 2 shows that the COM line 10 and the gate line 11, are located in-plane with respect to each other. The COM line has intentionally a large overlap region with the underlying pixel electrodes 12 in order to achieve the necessary capacitive coupling between the COM electrode and the pixel electrodes.

Figure 3:
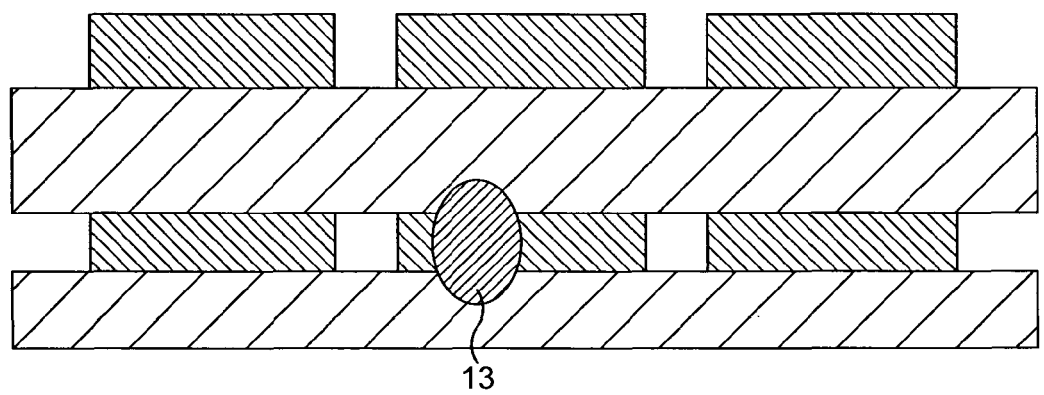
FIG. 3 illustrates an electrode short resulting from debris bridging the common electrode and the gate electrode.

It is often the case that during the above described processing steps, debris may be produced as is shown in FIG. 3. A problem arises when the debris 13 formed falls such that it is positioned so as to bridge the gap between the gate line and the COM line, thereby creating an electrical short between these two conductive layers of the device. The problem of shorts can arise with any patterning technique used for defining the gate and COM electrode patterns. However, a specific problem arises if the technique of SLAP is used to pattern the COM and gate electrodes. Dust particles that are deposited in between the deposition and the patterning, such as flakes falling onto the substrate during/after metal deposition lead to incomplete ablation of the metal layer underneath and can result in electrical shorts.

According to this embodiment of the present invention any debris that is large enough to span the in-plane gap between the gate line and COM line, or other unwanted intralayer shorts between electrodes on the same level may be identified using an automated optical inspection technique. For example, the automated optical inspection technique can scan the panel for abnormalities between like adjacent images. The abnormalities typically include substrate defects, poor patterning issues and debris.

When detecting abnormalities optically using an inspection tool, there are a number of parameters which can be adjusted to highlight the defect. These parameters can be split into two categories:

i). Video/image setup—the light conditions used When capturing an image ii). Post image analyses—software algorithms used to process the image In typical optical inspection tool the parameters involved in the video/image setup include:

a). resolution (relating to the size of the defect being detected);

b). spectral filter (if the optical inspection tool has several colours of light available);

c). imaging and illumination contrast (these values affect the amplitude and phase of light reflected from the panel, in order to highlight the specific layer of interest;

d). camera shutter (control of the amount of light falling on the camera when taking images);

e). light intensity (determines the amount of light allowed during inspection);

f). sensor offset (an offset applied to all grey levels, in order to shift the entire histogram);

g). sensor gain (to increase the overall gain of the camera, hence the grey level signal).

The parameters involved in the post image analysis include:

a). Grey Level high difference (represent upper limit on grey level range)

b). Grey level low difference (represent the lower limit on grey level range)

c). Edge sensitivity (the sensitivity when comparing pixels at the edge of a patterned element).

This technique is ideally suited to display arrays where the neighbouring images are identical, but most importantly, this technique only locates the position of display abnormality, hence resulting in a time and memory space saving. An example of a automated optical inspection tool which can identify defect greater than 15 microns is an Orbotech automated optical inspection tool. The user is then able to make a decision on whether the defect has the potential to selectively create a gate-COM electrical short. The above parameters can also be used for discriminating between critical defects/shorts that need to be repaired, and other defects that might not require repair.

Fiducials at the edge of the panel of transistors may be used as a marker point and so the coordinates of the fiducials are calculated and recorded. The coordinates of the fiducials are then transposed to locate the exact pixel (note that the original coordinate is not quantised to reference a point, for example, the centre of the pixel pattern, its coordinates refer to the centre of the defect itself), and are then entered into a software program and used to aid the repair laser to locate the abridged debris.

The optical detection system is attached to high resolution translation stages and allows the user to read an identified coordinate for every position on the panel. When an intralayer electrical short is detected, the location of the short is identified in terms of coordinate values for the short and these values are saved by a computer program, which then notes the position of the defect relative to an origin on the panel. Computer software may also be used as part of the optical detection system to translate this coordinate value into source and gate lines, which identifies the position of a defective pixel.

The optical method of detection and the laser ablation system are integrated together to ensure the smooth identification and selective isolation of electrical defects. The source and gate line coordinates obtained as described above, using the optical detection method to identify a defective pixel are loaded into a laser ablation system, which then may be used to ablate isolation marks in convenient positions on the backplane. The automated optical inspection tool can be programmed to record the portion of the pixel area in which the defect is found, and provides a potential for isolating all electrical defects that fall between the gate and COM lines within the described intra-layer arrangement.

Once the defects that require repair have been identified their positions are transferred to the laser repair system and the technique of SLAP is used to isolate the shorts. This can be achieved in a number of different ways. The laser beam may cut the COM to isolate the short. Preferably, the COM line is driven from both sides and the defect is isolated from both sides. In this situation the other pixels in the same line still have a functional COM line. If the COM line was only driven from one side, the pixel that lie on the opposite side of the defect from the driven end of the COM would no longer have a functional COM line and would display different optical contrast. In this way a line defect is repaired to affect only a small number (1-2) pixels.

Figure 4:
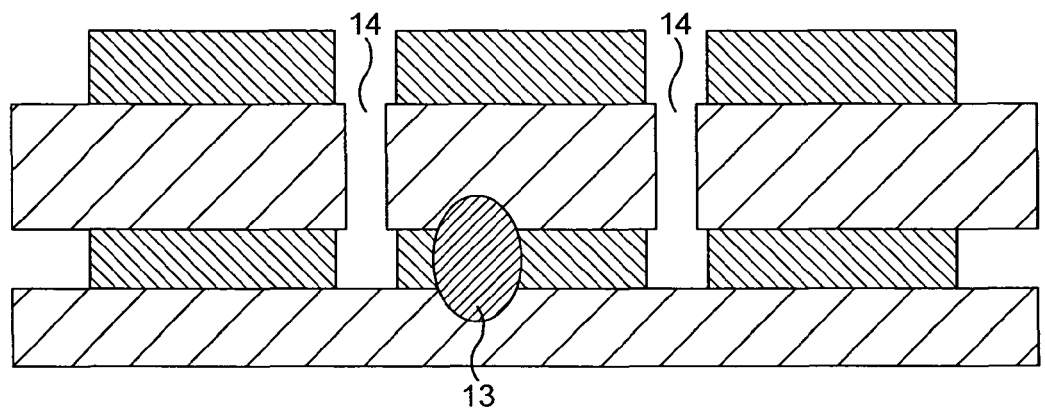
FIG. 4 shows cuts that have been made either side of the debris, therefore isolating the electrical short.

The first method of defect repair using SLAP is illustrated in FIG. 4. The selective ablation of the COM line occurs in two places 14, either side of the debris abridging the COM and gate lines, in the case of the COM line being driven from both ends. The COM layer is preferably ablated using a 248 nm pulsed excimer laser, such as the Lumonics PM800 laser (300 mJ, 30 W), although other lasers and wavelengths may also be used. The selective ablation of the conductive layers may occur without causing any damage to any of the underlying layers of the device.

Figure 5:
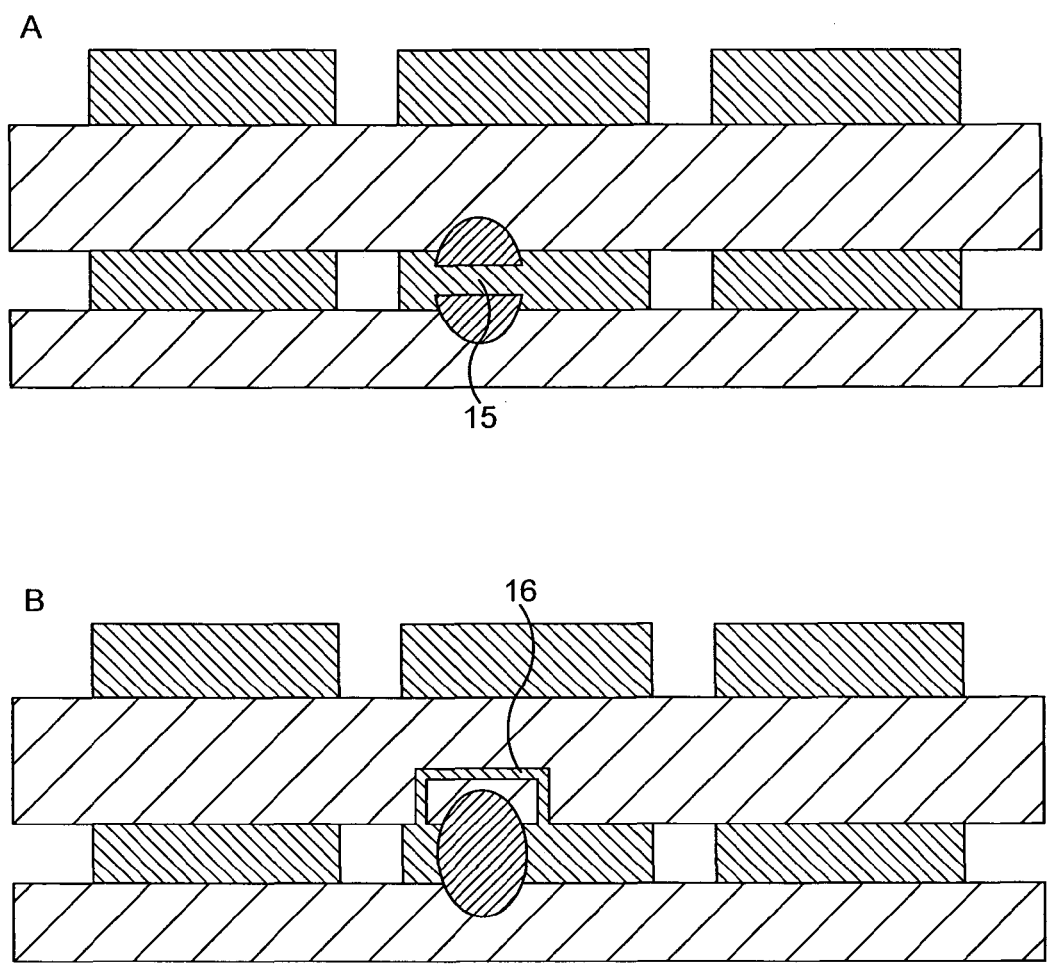
FIG. 5 shows an alternative isolation scheme for inter-layer short removal.

An alternative method for short isolation is to cut directly the metallic bridge 15 between the two electrodes by SLAP (FIG. 5A). In this case both line as well as pixel defects are eliminated. Alternatively, it might also be possible to isolate the portion of the COM line connecting to the short 16 by SLAP.

The above examples may be used separately or together in order to provide the required degree of selective isolation of defective areas. Further, there is additional flexibility within the present embodiment of the invention, as isolation of the defective pixels is able to occur at a later stage of the substrate processing.

The above described methods are able to be used for either a top gate or a bottom gate device.

The method can also be applied analogously to shorts between data interconnects at the source-drain level or shorts between neighbouring pixel electrodes at the pixel electrode level.

Figure 6:
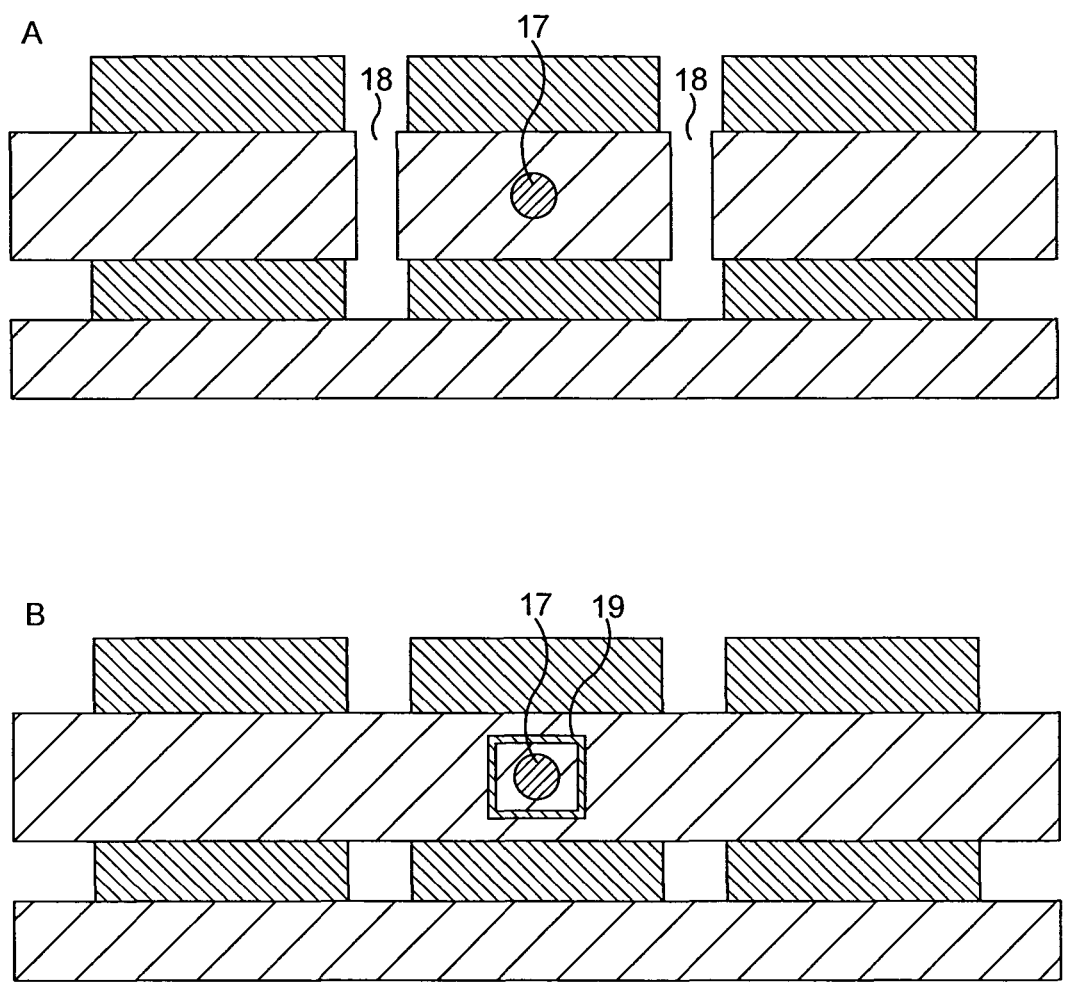
FIG. 6 shows examples for isolation scheme for inter-layer short removal.

The method of SLAP repair described above might also be used to isolate inter-layer defects as shown in FIG. 6. Here the gate or COM line is cut in an area 17 in order to isolate the inter-layer short (FIG. 6A). Again in order to avoid a line defect both sides of the interconnect line need to be driven. It might also be possible to isolate the inter-layer short within the area of the interconnect 18 such that no cutting of the conductivity is necessary (FIG. 6B). However, in this method higher resolution detection of the defect as well as higher resolution SLAP patterning is required. The inter-layer defect might be detected either optically as described above or using other techniques according to the prior art, such as detecting optical or infrared emission from the defect.

The methods described above based on optical defect detection or other defect detection combined with defect repair by SLAP within a multiple layer thin film transistor structure may be used in both inorganic devices, such as amorphous silicon or polycrystalline silicon active matrix displays and within polymer electronics, such as, but not limited to, organic TFT active matrix electronic paper displays. They might also be applied to other integrated circuits involving other active or passive devices, such as, but hot limited to, light-emitting diodes, capacitors, multilayer interconnect structures etc. They can be applied to both isolation of intra-layer or inter-layer shorts.

Such a short isolation technique may also, for example, be applied to the following: electrical shorts between interconnects; electrical shorts between electrodes and interconnects, such as between a COM line and agate electrode; and electrical shorts between electrodes; such as between top pixel electrodes, or between source and drain electrodes; or between gate and source and/or drain electrodes.

The defect detection and repair might be performed in-line with the process, i.e. before additional layers are deposited on the substrate. Alternatively, the technique can be applied after additional layers have been deposited. In this case the additional layers need to be removed locally from the substrate in the area of the defect. In some cases this might be achieved automatically as part of the SLAP process. In other cases the additional layers might have to be removed separately, such as by additional laser ablation steps, that might involve, for example, different laser wavelength, intensity or general exposure conditions than those for the short removal by SLAP.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of processing a product defining a plurality of part or whole electronic devices, the method comprising:
   patterning a conductive layer by a laser ablation technique to produce a patterned conductive layer;
   automated identifying of an electrical defect in the patterned conductive layer by a comparison of the pattern of a plurality of regions of the product; and
   the step of eliminating said electrical defect by further application of said laser ablation technique.

2. A method according to claim 1, wherein the electrical defect is an electrical short, and the step of eliminating said electrical defect comprises removing conductive material so as to isolate one conductive element from another, co-planar conductive element.

3. A method according to claim 2, wherein the laser ablation is carried out so as to avoid any substantial degradation of a layer directly below the conductive material to be removed.

4. A method according to claim 3, comprising using a single laser pulse to remove said conductive material and expose the layer directly below the conductive material.

5. A method according to claim 1, wherein the electrical defect is an electrical short caused by a piece of unwanted conductive material bridging two conductive regions of the plurality of electronic devices.

6. A method according to claim 5, wherein the two conductive regions are an electrode and an interconnect.

7. A method according to claim 6, wherein the electrode is a gate electrode and the interconnect is a COM line.

8. A method according to claim 5, wherein the two conductive regions are the source and drain electrodes of one of said plurality of electronic devices.

9. A method according to claim 5, wherein the two conductive regions are the pixel electrode of one electronic device and the pixel electrode of another electronic device.

10. A method according to claim 5, wherein the two conductive regions are a gate electrode and a source and/or drain electrode.

11. A method according to claim 1, wherein the plurality of electronic devices include one or more organic elements.

12. A method according to claim 5, comprising laser ablation of a part of at least one of said two conductive regions.

13. A method of processing a product defining a plurality of part or whole electronic devices, the method comprising:
provided a patterned conductive layer defining at least two conductive lines;
automated identifying of an electrical defect caused by a conductive bridge between the said two conductive lines by a comparison of the pattern of a plurality of regions of the product; and
isolating the conductive bridge by removing one or more parts of one of said conductive lines.

14. A method according to claim 13, wherein isolating the conductive bridge by removing one or more parts of one of said conductive lines is done whilst maintaining a function of said one of said conductive lines.

15. A method of processing a product defining a plurality of part or whole electronic devices, the method comprising:
automated identifying of an electrical defect caused by a conductive bridge between a conductive element at an upper level and a conductive element at a lower level by a comparison of the pattern of a plurality of regions of the product; and
isolating the conductive bridge by removing one or more parts of one of said upper conductive element.

16. A method according to claim 15, wherein isolating the conductive bridge by removing one or more parts of one of said upper conductive element is done whilst maintaining a function of said upper conductive element.

\* \* \* \* \*